(12) United States Patent
Dymshits et al.

(10) Patent No.: US 9,801,435 B2
(45) Date of Patent: Oct. 31, 2017

(54) HEAT-RESISTANT SYNTHETIC JEWELRY MATERIAL

(71) Applicant: Karen Khorenovich Avakyan, Moscow (RU)

(72) Inventors: Olga Sergeevna Dymshits, St. Petersburg (RU); Alexander Alexandrovich Zhilin, St. Petersburg (RU)

(73) Assignee: KAREN KHORENOVICH AVAKYAN, Moscow (RU)

( * ) Notice: Subject to any disclaimer, the term of this patent is extended or adjusted under 35 U.S.C. 154(b) by 0 days.

(21) Appl. No.: 14/890,843

(22) PCT Filed: Jun. 25, 2013

(86) PCT No.: PCT/RU2013/000538
§ 371 (c)(1),
(2) Date: Nov. 12, 2015

(87) PCT Pub. No.: WO2014/185813
PCT Pub. Date: Nov. 20, 2014

(65) Prior Publication Data
US 2016/0113363 A1    Apr. 28, 2016

(30) Foreign Application Priority Data
May 13, 2013 (RU) ................................ 2013122741

(51) Int. Cl.
| | |
|---|---|
| C03C 10/04 | (2006.01) |
| A44C 27/00 | (2006.01) |
| C30B 29/20 | (2006.01) |
| C30B 29/34 | (2006.01) |
| C03C 3/07 | (2006.01) |
| C03C 3/105 | (2006.01) |
| C03C 4/02 | (2006.01) |
| C03C 10/00 | (2006.01) |
| B82Y 40/00 | (2011.01) |

(52) U.S. Cl.
CPC ............ *A44C 27/001* (2013.01); *C03C 3/07* (2013.01); *C03C 3/105* (2013.01); *C03C 4/02* (2013.01); *C03C 10/0018* (2013.01); *C03C 10/0054* (2013.01); *C30B 29/20* (2013.01); *C30B 29/34* (2013.01); *B82Y 40/00* (2013.01)

(58) Field of Classification Search
CPC ............ C03C 10/0018; C03C 10/0027; A44C 27/001
See application file for complete search history.

(56) References Cited

U.S. PATENT DOCUMENTS

| | | |
|---|---|---|
| 3,788,865 A | 1/1974 | Babcock et al. |
| 5,446,008 A | 8/1995 | Krolla et al. |
| 5,491,115 A | 2/1996 | Pfitzenmaier et al. |
| 5,580,363 A | 12/1996 | Goto et al. |
| 6,464,765 B1 | 10/2002 | Garcia et al. |
| 7,216,510 B2 | 5/2007 | Doehring et al. |
| 7,981,823 B2 | 7/2011 | Siebers et al. |
| 8,431,498 B2 | 4/2013 | Hsu et al. |
| 9,446,982 B2 | 9/2016 | Siebers et al. |
| 2009/0011925 A1 | 1/2009 | Felix et al. |

FOREIGN PATENT DOCUMENTS

| | | |
|---|---|---|
| CN | 1202469 | 12/1998 |
| CN | 1466614 | 1/2004 |
| CN | 102050581 | 5/2011 |
| CN | 103003210 | 3/2013 |
| DE | 102010032113 | 1/2012 |
| EP | 1837314 | 9/2007 |
| JP | 56153131 | 3/1986 |
| JP | H07157331 | 6/1995 |
| JP | H07172862 | 7/1995 |
| RU | 2162456 | 1/2001 |
| RU | 2215455 | 11/2003 |
| RU | 2253706 | 6/2005 |
| RU | 2314268 | 1/2008 |
| RU | 2336005 | 10/2008 |
| RU | 2426488 | 8/2011 |

OTHER PUBLICATIONS

International Search Report for PCT/RU2013/000538, English translation attached to original, Both completed by the Russian Patent Office on Jan. 14, 2014, All together 5 Pages. Extended European Search Report for European Patent Application No. EP 13884799.1, Completed by the European Patent Office on Sep. 16, 2016, 8 Pages.

*Primary Examiner* — Karl Group
(74) *Attorney, Agent, or Firm* — Brooks Kushman P.C.

(57) ABSTRACT

A heat-resistant synthetic jewelry material having a transparent, semitransparent or nontransparent composite nanocrystalline material on the basis of nanosized oxide and silicate crystalline phases. The material includes at least one of the following crystalline phases: spinel, quartz-like phases, sapphirine, enstatite, petalite-like phase, cordierite, willemite, zirconium, rutile, zirconium titanate, zirconium dioxide with a content of ions of transition elements, rare-earth elements and precious metals of from 0.001 to 4 mol %. One of the crystalline phases is additionally quartz-like solid solutions of lithium magnesium zinc aluminosilicates with a virgilite or keatite structure. The composition is selected from the following components,s $SiO_2$, $Al_2O_3$, MgO, ZnO, $Li_2O$, PbO, $ZrO_2$, $TiO_2$, NiO, CoO, CuO, $Cr_2O_3$, $Bi_2O_3$, $Fe_2O_3$, $MnO_2$, $CeO_2$, $Nd_2O_3$, $Er_2O_3$, $Pr_2O_3$ and Au.

10 Claims, No Drawings

HEAT-RESISTANT SYNTHETIC JEWELRY MATERIAL

CROSS-REFERENCE TO RELATED APPLICATION

This application is the U.S. national phase of PCT Application No. PCT/RU2013/000538 filed on Jun. 25, 2013, which claims priority to RU Patent Application No. 2013122741 filed on May 13, 2013, the disclosures of which are incorporated in their entirety by reference herein.

The present invention is related to the production of synthetic materials for jewellery intended for the substitution of natural precious stones.

Synthetic materials are traditionally used in jewellery for the substitution of natural gemstones. Synthetic gemstones can be divided into two groups. The synthetic gemstones of the first group have the same composition and physical properties as natural precious stones. Among them, there are amethyst, citrine, smoky quartz, alexandrite, ruby and spinel fabricated by Czochralski process, synthetic corundum and spinel manufactured by Verneuil process, hydrothermal emerald.

Artificial, synthetic gemstones of the second group imitate the appearance, particularly, the colour of natural gemstones while having quite different compositions and physical properties. Moreover, some of them do not exist in nature. The examples of such materials are yttrium aluminum garnet, gallium gadolinium garnet, and phianite doped with oxides of rare-earth and transition elements. The significant disadvantage of synthetic gemstones is inhomogeneity of their colouration caused by the gradual changes of the intensity of colouration from the beginning of crystallization to its end. This inhomogeneity owes to the fact that the concentration of colouring dopants in melts (or solutions) usually changes in the course of the crystallization due to selective entering the crystals by the dopants. Because of this, as crystals grow, the dopants concentration in them can change. The most intense inhomogeneity is the inhomogeneity of green, blue, and brown phyanites, blue sapphire, green and blue yttrium aluminum garnet, etc. It is common knowledge that growing of these crystals, their cutting and sorting by the colour are labor consuming and very difficult from the manufacturing point of view. Besides, many coloured synthetic gemstones produced under reducing conditions change their colour upon heating in the open air (due to the oxidation of the colouring agent).

Colourless and coloured glass (crystal glass, rhinestones), is widely used in bijouterie and in rather cheap jewellery. Glass is usually homogeneously coloured, however, it ranks below synthetic gems in terms of refractive index, glitter, hardness, density, and heat resistance.

The main disadvantage of many synthetic materials and glasses is their low thermal shock resistance, i.e., they fail to maintain integrity at sharp temperature drops. They often crack being unable to withstand the thermal shock. This disadvantage prevents material grinding and polishing using a high-speed processing. A convenient and inexpensive technology of jewellery manufacturing "casting with stones" cannot be applied to such materials.

BACKGROUND OF THE INVENTION

RU Pat. No 2,336,005 published on 20 Oct. 2008 under indexes МПК A44C27/00, B44C5/06, B44F9/04, C04B30/00, C03C6/02, B28D5/00 claims the mixture of the raw materials for manufacturing the parts of jewellery intended to substitute the precious stones. The mixture comprises the crushed silicate glass and wastes of rubies and/or sapphires, and/or emeralds, and/or alexandrites, and/or noble spinels, and/or euclase, and/or topazes, and/or aquamarines, and/or heliodors, and/or garnets, and/or amethysts, and/or hyacinths, and/or cordierites, and/or turmalines, and/or rock-crystals, and/or smoky quartz, and/or chrysoprase, and/or carnelian. In the invention, the silicate glass with the melting temperature of 500-950° C. is used. The composition material is produced by stacking together the wastes of precious and semiprecious stones using the silicate glass with very low melting temperature. Parts produced by this procedure have low mechanical strength. They cannot be used in serial production as their appearance cannot be reproduced. Due to the difference in the coefficients of thermal expansion of the silicate matrix and fillers made of precious stone wastes, the resultant composite material has low thermal shock resistance. Above all, a convenient and inexpensive technology of jewellery manufacturing "casting with stones" cannot be applied to such materials due to the low melting temperature of the silicate glass.

RU Pat. 2,162,456 published on 27 Jan. 2001 with indexes МПК C04B5/14 and C01B33/113 outlines the manufacturing of synthetic material with the noble opal structure. Synthetic material is produced by the following stages: 1. preparing the monodisperse suspension of amorphous silica with globule sizes of 140-600 nm.; 2. precipitating, layer by layer the precipitate and drying at 100-150° C. for 10-30 h, after that, further drying the precipitate at a pressure of 1-10 Pa.; 3. after drying, annealing the precipitate at the temperature of 350-400° C. and the pressure of 15-45 MPa in the atmosphere of water vapor and tetraethoxysilane; and 4. filling the precipitate with silica sol and heat-treating at 400-600° C. for 1-2 h.

This method is very difficult, labor- and time-consuming, the product cost is very high. In addition, by this method, obtaining materials of various phase assemblage, structures and colours is impossible. The main drawback of this material is that it is very brittle and cracks during dehydration, which occurs quickly especially upon heating. It is worth noting that the processes are rather intensive at as low temperature as 100° C.

RU Pat. No 2,215,455 published on 10 Nov. 2003 with indexes МПК A44C17/00, C30B31/02, C30B33/02 presents the method for colouring natural and synthetic gemstones. The method is intended for colouring the colourless and pale blue sapphires, colourless topazes and quartz. The method consists of placing the grinded gemstones into a thin cobalt oxide powder comprising a mixture of CoO and $Co_2O_3$ in the ratio of 1:1 mixed with ZnO in the ratio of 1:(0.25-3). The mixture is heat-treated in the oxidizing conditions at 900-1250° C.

The parts prepared by said method are coloured only on the suRUace. Their additional grinding and polishing is impossible because the thin coloured layer becomes damaged. This method provides only blue colouring, other colour tints cannot be achieved.

RU Pat. No 2,253,706 published on 20 Jan. 2005 with indexes МПК С30И 29/20, C30B28/00, C30B31/02, C30B33/02 outlines the jewellery material—synthetic polycrystalline corundum "Mariite" and its method of synthesis. The material consists of alumina, colour dopants and paraffin wax used as a binder. The colour dopants are molybdenum, wolfram, neodymium, erbium, chromium oxides. The production of the material used as parts for jewellery is made by forming the mixture with the use of molding machines under a pressure of 4 atm. followed by the subsequent firing in furnaces of continuous or periodic action. Then the coloured translucent potsherd is polished with diamond powder. This method ensures only production of semitransparent material; transparent material cannot be produced by this method, which significantly reduces the variety of the final articles. In addition, the obtained materials are of the limited range of colours: there are no blue, green, yellow, brown materials. The nature of the binding agent—paraffin wax—prevents material operation at elevated temperatures.

It is well known that glass-ceramics with near zero thermal expansion coefficients are produced by the controlled crystallization of solid solutions with β-quartz (β-eucryptite) structure in glasses of the lithium aluminosilicate system. This method is used in production of coloured transparent thermal shock resistant kitchen ware, cooking tops, windows of metallurgic and heating furnaces. Researches from Corning Inc., USA, developed glass compositions converted to glass-ceramics by heat-treatment and coloured to various tints of yellow, brown and purple colours. U.S. Pat. No. 3,788,865, МПК C03C10/14, published in 1974, describes production of transparent coloured glass-ceramics, containing β-eucryptite crystals and coloured with the following dopants: $V_2O_5$, MnO, $Cr_2O_3$, $Fe_2O_3$, CuO, NiO and ZnS. However, the resulting materials have a relatively low hardness, which is an important disadvantage for jewellery materials. U.S. Pat. No. 5,491,115, published on 13 Feb. 1996 with indexes МПК C03C010/14, C03C010/12, outlines production of purple-red and violet colour in transparent thermal shock resistant material. However, all these materials have a relatively low hardness, which is an important disadvantage for jewellery materials.

RU Pat. No 2,42,6488, on 20 Aug. 2010 with indexes МПК A44C17/00, A44C27/00, the prior art, presents the material with high hardness, chemical resistance and colour resistance against thermal shock. This is a synthetic transparent, translucent or opaque nanocrystalline composite material for jewellery based on at least one of the following nanosized oxide or silicate crystalline phases: spinel, quartz-like phases, sapphirine, enstatite, petalite-like phase, cordierite, willemite, zircon, rutile, zirconium titanate, zirconium dioxide, with a content of ions of transition, rare earth elements and noble metals in an amount from 0.001 to 4.0 mol %.

Despite its unique properties, the material does not have an ultralow thermal expansion coefficient (CTE) (below $30 \cdot 10^{-7}$ $K^{-1}$) which means that it does not have the required high thermal shock resistance. The lack of the required high thermal shock resistance impedes the rapid machining, in particular, the laser suRUace treatment, and making holes with lasers. The method of "casting with precious stones" cannot be used because the material that contains crystalline phases with high thermal expansion coefficient can crack during thermal cycling. Furthermore, its melting temperature range of 1570-1640° C., which complicates refining and homogenization of glass using the standard glassmaking equipment and require high energy consumption.

Thus, among the analogues and the prototype there is no material that would meet all the requirements of modern jewellery.

SUMMARY OF THE INVENTION

The object of the invention is to provide a jewellery material having high thermal shock resistance and low CTE as compared with the known materials, including the prototype, and to decrease the melting temperature to below 1570° C.

The technical result is achieved by the development of a thermal shock resistant transparent, translucent or opaque material based on at least one of the following oxide or silicate crystalline phases: spinel, sapphirine, enstatite, petalite-like phase, and/or magnesium aluminotitanates, cordierite, willemite, zircon, rutile, zirconium titanate, zirconium dioxide, with a content of at least one of the following ions of transition and rare earth elements and noble metals in an amount from 0.001 to 4.0 mol %, in which, as opposed to the prototype, there is an additional crystalline phase, solid solution of lithium-magnesium-zinc-aluminosilicate with virgilite (β-quartz) or keatite structure.

The composition of the proposed material is selected from the following components (mol. %): $SiO_2$—45-72; $Al_2O_3$—15-30; MgO—0.1-23.9; ZnO—0.1-29; $Li_2O$—1-18; PbO—0.1-7.0; $ZrO_2$—0.1-10; $TiO_2$—0.1-15; NiO—0.001-4.0; CoO—0.001-3.0; CuO—0.001-4.0; $Cr_2O_3$—0.001-1.0; $Bi_2O_3$—0.001-3.0; $Fe_2O_3$—0.001-3.0; $MnO_2$—0.001-3.0; $CeO_2$—0.001-3.0; $Nd_2O_3$—0.001-3.0; $Er_2O_3$—0.001-3.0; $Pr_2O_3$—0.001-3.0; Au—0.001-1.0.

The thermal-shock-resistant synthetic transparent, translucent or opaque nanocrystalline composite material for jewellery is prepared from the compositions shown in Table 1.

TABLE 1

| Component | Concentration (mol %) |
|---|---|
| $SiO_2$ | 45-72 |
| $Al_2O_3$ | 15-30 |
| MgO | 0.1-23.9 |
| ZnO | 0.1-29 |
| $Li_2O$ | 1-18 |
| $ZrO_2$ | 0.1-10 |
| $TiO_2$ | 0.1-15 |
| PbO | 0.1-7 |
| NiO | 0.001-4.0 |
| CoO | 0.001-3.0 |
| CuO | 0.001-4.0 |
| $Cr_2O_3$ | 0.001-1.0 |
| $Bi_2O_3$ | 0.001-3 |
| $Fe_2O_3$ | 0.001-3.0 |
| $MnO_2$ | 0.001-3.0 |
| $CeO_2$ | 0.001-3.0 |
| $Nd_2O_3$ | 0.001-3.0 |
| $Er_2O_3$ | 0.001-3.0 |
| $Pr_2O_3$ | 0.001-3.0 |
| Au | 0.001-1.0 | where $TiO_2$, $ZrO_2$, NiO, CoO, CuO, $Cr_2O_3$, $Bi_2O_3$, $Fe_2O_3$, $MnO_2$, $CeO_2$, $Nd_2O_3$, $Er_2O_3$, $Pr_2O_3$ and Au are added above 100% of the base composition. A body of the first five components listed in Table 1 ensures formation of the aluminosilicate network. PbO enters this network, increasing the refractive index of the material. $TiO_2$ and $ZrO_2$ are used a nucleating agents. NiO, CoO, CuO, $Cr_2O_3$, $Bi_2O_3$, $Fe_2O_3$, $MnO_2$, $CeO_2$, $Nd_2O_3$, $Er_2O_3$, $Pr_2O_3$ and Au are colouring agents.

The technical solution is prepared as follows:
1. Melting of the mixture of raw materials selected from the starting components listed in Table 1, at the temperature of 200-300° C. above liquidus, at 1520-1550° C.
2. Cooling of the glass melt to a temperature of 1300-1410° C., shaping and annealing the material at 620-650° C., (this temperature corresponds to the viscosity of $10^{10.5}$-$10^{11}$ Pa·s).

3. Converting the initial glass into a synthetic transparent, translucent or opaque nanocrystalline composite material for jewellery by additional heat treatment: heating, at a temperature of from 660 to 800° C., at which nucleation occurs, for 1-24 hours, and forming, at a temperature of from 780 to 1200° C. for 1-24 hours, at least one of the following nanoscale oxide and crystalline silicate phases: solid solutions of lithium-magnesium-zinc-aluminosilicates with virgilite (β-quartz) or keatite structure, spinel, sapphirine, enstatite, petalite-like phase, cordierite, willemite, zircon, rutile, zirconium titanate, zirconium dioxide.
4. Cooling the synthetic transparent, translucent or opaque nanocrystalline composite material to the room temperature.

Ions of transition metals, rare earth elements and noble metals in an amount from 0.001 to 4 mol. % provide colouring of the material.

The examples of compositions, heat treatment conditions and properties of the proposed materials are given in Table 2. The table shows that the glass-ceramics of proposed compositions, prepared according to the listed heat-treatment schedules, have optical characteristics similar to those of the main natural coloured minerals, demonstrate adaptability in production, have low coefficient of thermal expansion, high hardness, chemical resistance and colour stability to thermal shock; their melting temperature is decreased as compared with the prior art.

Components in the form of oxides and carbonates were mixed, milled to obtain a homogeneous batch; the batch was inserted to the crucible made of quartz ceramics, which was placed into the furnace. The batch was melted at a temperature of 1520-1550° C. for about 6 hours while stirring with a stirrer made of quartz ceramics and then was cast into a steel mold to form a transparent bar.

The Best Examples

TABLE 2

| | Sample No | | |
|---|---|---|---|
| | 1 | 2 | 3 |
| Component | Concentration (mol %) | | |
| $SiO_2$ | 45 | 54.9 | 72 |
| $Al_2O_3$ | 30 | 15 | 16 |
| MgO | 23.9 | 0.1 | 4 |
| ZnO | 0.1 | 29 | 4 |
| $Li_2O$ | 1 | 1 | 4 |
| $ZrO_2$ | 0.1 | 10 | 6 |
| $TiO_2$ | 15 | 3 | 0.1 |
| PbO | 0.1 | 2 | 7.0 |
| NiO | 4 | 1.0 | 0.001 |
| CoO | 0.001 | 0.005 | 3.000 |
| CuO | 0.001 | 0.001 | 0.001 |
| $Cr_2O_3$ | 0.001 | 0.001 | 0.001 |
| $Bi_2O_3$ | 0.001 | 0.001 | 0.001 |
| $Fe_2O_3$ | 0.001 | 0.001 | 0.001 |
| $MnO_2$ | 0.001 | 0.001 | 0.001 |
| $CeO_2$ | 0.001 | 0.001 | 0.001 |
| $Nd_2O_3$ | 0.001 | 0.001 | 0.001 |
| $Er_2O_3$ | 0.001 | 0.001 | 0.001 |
| $Pr_2O_3$ | 0.001 | 0.001 | 0.001 |
| Au | 0.001 | 0.001 | 0.001 |
| Heat-treatment conditions | | | |
| 1 stage | 660° C., 24 h | 800° C., 4 h | 770° C., 12 h |
| 2 stage | 900° C., 24 h | 1000° C., 12 h | 1200° C., 1 h |
| Colour | Green, transparent | Green, opaque | Green, opaqueй |
| Thermal expansion coefficient ($\times 10^{-7}$/° C.) | 15.0 | 19.0 | 22.0 |
| Glass melting temperature, ° C. | 1540 | 1540 | 1550 |
| Crystalline phases | Solid solution of lithium-magnesium-zinc-aluminosilicate with virgilite (β-quartz) structure Spinel Magnesium aluminotitanates | Solid solution of lithium-magnesium-zinc-aluminosilicate with β-spodumene (keatite) structure Spinel Zircon Petalite-like phase Zirconium titanate Zirconium dioxide | Solid solution of lithium-magnesium-zinc-aluminosilicate with β-spodumene (keatite) structure Spinel Cordierite Rutile Zirconium dioxide |

| | Sample No | | |
|---|---|---|---|
| | 4 | 5 | 6 |
| Component | Concentration (mol %) | | |
| $SiO_2$ | 45 | 54.9 | 70 |
| $Al_2O_3$ | 30 | 15 | 18 |

TABLE 2-continued

| | | | |
|---|---|---|---|
| MgO | 12.9 | 0.1 | 6 |
| ZnO | 0.1 | 12 | 3 |
| Li$_2$O | 12 | 18 | 3 |
| ZrO$_2$ | 0.1 | 10 | 5 |
| TiO$_2$ | 15 | 0.1 | 5 |
| PbO | 0.1 | 2 | 7.0 |
| NiO | 0.001 | 0.001 | 0.001 |
| CoO | 0.001 | 0.001 | 0.001 |
| CuO | 4.000 | 0.050 | 0.000 |
| Cr$_2$O$_3$ | 0.001 | 0.001 | 0.001 |
| Bi$_2$O$_3$ | 0.001 | 0.001 | 3.000 |
| Fe$_2$O$_3$ | 0.001 | 0.001 | 0.001 |
| MnO$_2$ | 0.001 | 0.001 | 0.001 |
| CeO$_2$ | 0.001 | 0.001 | 0.001 |
| Nd$_2$O$_3$ | 0.001 | 0.001 | 0.001 |
| Er$_2$O$_3$ | 0.001 | 0.001 | 0.001 |
| Pr$_2$O$_3$ | 0.001 | 3.000 | 0.001 |
| Au | 0.001 | 0.001 | 0.001 |
| | Heat-treatment conditions | | |
| 1 stage | 720° C., 6 h | 700° C., 12 h | 750° C., 1 h |
| 2 stage | 1050° C., 24 h | 850° C., 12 h | 1200° C., 1 h |
| Colour | Brown, opaque | Bluish-green, transparent | Deep-brown, opaque |
| Thermal expansion coefficient (×10$^{-7}$/° C.) | 18.0 | 5.0 | 12.0 |
| Glass melting temperature, ° C. | 1520 | 1520 | 1550 |
| Crystalline phases | Solid solution of lithium-magnesium-zinc-aluminosilicate with β-spodumene (keatite) structure Sapphirine Enstatite Magnesium aluminotitanates | Solid solution of lithium-magnesium-zinc-aluminosilicate with virgilite (β-quartz) structure Spinel Zirconium titanate Zirconium dioxide | Solid solution of lithium-magnesium-zinc-aluminosilicate with β-spodumene (keatite) structure Cordierite Zirconium titanate |

| | Sample No | | |
|---|---|---|---|
| | 7 | 8 | 9 |
| Component | Concentration (mol %) | | |
| SiO$_2$ | 45 | 54.9 | 70 |
| Al$_2$O$_3$ | 30 | 15 | 18 |
| MgO | 14.9 | 0.1 | 6 |
| ZnO | 0.1 | 20 | 2 |
| Li$_2$O | 10 | 10 | 4 |
| ZrO$_2$ | 0.1 | 10 | 5 |
| TiO$_2$ | 15 | 3 | 0.1 |
| PbO | 0.1 | 2 | 7.0 |
| NiO | 0.001 | 0.001 | 0.001 |
| CoO | 0.001 | 0.001 | 0.001 |
| CuO | 0.001 | 0.001 | 0.001 |
| Cr$_2$O$_3$ | 1.000 | 0.001 | 0.001 |
| Bi$_2$O$_3$ | 0.001 | 0.001 | 0.001 |
| Fe$_2$O$_3$ | 0.001 | 3.000 | 0.001 |
| MnO$_2$ | 0.001 | 0.001 | 0.001 |
| CeO$_2$ | 0.001 | 0.100 | 3.000 |
| Nd$_2$O$_3$ | 0.001 | 0.001 | 0.001 |
| Er$_2$O$_3$ | 0.001 | 0.001 | 0.001 |
| Pr$_2$O$_3$ | 0.001 | 0.001 | 0.001 |
| Au | 0.001 | 0.001 | 0.001 |
| | Heat-treatment conditions | | |
| 1 stage | 680° C., 24 h | 800° C., 12 h | 780° C., 1 h |
| 2 stage | 800° C., 24 h | 1100° C., 12 h | 1200° C., 1 h |
| Colour | Smoky, transparent | Light-brown, opaque | Brown, opaque |
| Thermal expansion coefficient (×10$^{-7}$/° C.) | 3.0 | 10.0 | 12.0 |
| Glass melting temperature, ° C. | 1530 | 1520 | 1545 |
| Crystalline phases | Solid solution of lithium-magnesium-zinc-aluminosilicate | Solid solution of lithium-magnesium-zinc-aluminosilicate | Solid solution of lithium-magnesium-zinc-aluminosilicate |

TABLE 2-continued

| | | | |
|---|---|---|---|
| | with virgilite (β-quartz) structure Spinel Magnesium aluminotitanates | with virgilite (β-quartz) structure Willemite Spinel Zircon Zirconium titanate Zirconium dioxide | with virgilite (β-quartz) structure Cordierite Zirconium dioxide |

| | Sample No | | |
|---|---|---|---|
| | 7 | 8 | 9 |
| Component | Concentration (mol %) | | |
| $SiO_2$ | 45 | 54.9 | 70 |
| $Al_2O_3$ | 30 | 15 | 18 |
| MgO | 10.0 | 0.1 | 6 |
| ZnO | 0.1 | 16 | 3 |
| $Li_2O$ | 14.9 | 14 | 3 |
| $ZrO_2$ | 0.1 | 10 | 5 |
| $TiO_2$ | 15 | 3 | 0.1 |
| PbO | 0.1 | 2 | 7.0 |
| NiO | 0.001 | 1.0 | 0.001 |
| CoO | 0.001 | 0.001 | 0.001 |
| CuO | 0.001 | 0.001 | 0.001 |
| $Cr_2O_3$ | 0.001 | 0.001 | 0.001 |
| $Bi_2O_3$ | 0.001 | 0.001 | 0.001 |
| $Fe_2O_3$ | 0.001 | 0.001 | 0.001 |
| $MnO_2$ | 3.000 | 0.003 | 0.001 |
| $CeO_2$ | 0.000 | 0.000 | 0.000 |
| $Nd_2O_3$ | 0.001 | 0.001 | 0.001 |
| $Er_2O_3$ | 0.001 | 0.500 | 3.000 |
| $Pr_2O_3$ | 0.001 | 0.001 | 0.001 |
| Au | 0.001 | 0.001 | 0.001 |
| | Heat-treatment conditions | | |
| 1 stage | 680° C., 24 h | 780° C., 12 h | 800° C., 1 h |
| 2 stage | 820° C., 24 h | 900° C., 12 h | 1200° C., 1 h |
| Colour | Light-brown, transparent | Rosy, transparent | Rosy, opaque |
| Thermal expansion coefficient ($\times 10^{-7}/°$ C.) | 2.0 | 5.0 | 21.0 |
| Glass melting temperature, ° C. | 1520 | 1520 | 1550 |
| Crystalline phases | Solid solution of lithium-magnesium-zinc-aluminosilicate with virgilite (β-quartz) structure Spinel Magnesium aluminotitanates | Solid solution of lithium-magnesium-zinc-aluminosilicate with virgilite (β-quartz) structure Spinel Zirconium titanate Zirconium dioxide | Solid solution of lithium-magnesium-zinc-aluminosilicate with β-spodumene (keatite) structure Cordierite Zirconium dioxide |

| | Sample No | | |
|---|---|---|---|
| | 4 | 5 | 6 |
| Component | Concentration (mol %) | | |
| $SiO_2$ | 45 | 54.9 | 70 |
| $Al_2O_3$ | 30 | 15 | 18 |
| MgO | 12.9 | 0.1 | 6 |
| ZnO | 0.1 | 12 | 3 |
| $Li_2O$ | 12 | 18 | 3 |
| $ZrO_2$ | 0.1 | 10 | 5 |
| $TiO_2$ | 15 | 0.1 | 5 |
| PbO | 0.1 | 2 | 7.0 |
| NiO | 0.001 | 0.001 | 0.001 |
| CoO | 0.001 | 0.001 | 0.001 |
| CuO | 0.001 | 0.001 | 0.001 |
| $Cr_2O_3$ | 0.001 | 0.001 | 0.001 |
| $Bi_2O_3$ | 0.001 | 0.001 | 0.001 |
| $Fe_2O_3$ | 0.001 | 0.001 | 0.001 |
| $MnO_2$ | 0.001 | 0.001 | 0.001 |
| $CeO_2$ | 0.001 | 0.001 | 0.001 |
| $Nd_2O_3$ | 0.001 | 0.001 | 3.000 |
| $Er_2O_3$ | 0.001 | 0.001 | 0.001 |
| $Pr_2O_3$ | 0.001 | 0.001 | 0.001 |
| Au | 0.003 | 1.000 | 0.001 |

TABLE 2-continued

| | Heat-treatment conditions | | |
|---|---|---|---|
| 1 stage | 720° C., 6 h | 700° C., 12 h | 750° C., 1 h |
| 2 stage | 1050° C., 24 h | 850° C., 12 h | 1200° C., 1 h |
| Colour | Purple, opaque | Red, transparent | Lilac, opaque |
| Thermal expansion coefficient ($\times 10^{-7}$/° C.) | 18.0 | 3.0 | 12.0 |
| Glass melting temperature, ° C. | 1520 | 1520 | 1550 |
| Crystalline phases | Solid solution of lithium-magnesium-zinc-aluminosilicate with β-spodumene (keatite) structure Sapphirine Enstatite Magnesium aluminotitanates | Solid solution of lithium-magnesium-zinc-aluminosilicate with virgilite (β-quartz) structure Spinel Zirconium titanate Zirconium dioxide | Solid solution of lithium-magnesium-zinc-aluminosilicate with β-spodumene (keatite) structure Cordierite Zirconium dioxide |

INDUSTRIAL APPLICABILITY

Introduction of $SiO_2$ in an amount less than suggested does not lead to the formation of transparent material during glass melting, and the introduction of $SiO_2$ in an amount greater than suggested increases the melting temperature of the melt to temperatures exceeding 1600° C., thus no standard glass-making equipment can be used for glass melting. It impedes obtaining the pure glass melt. Introduction of $Li_2O$ in an amount smaller and larger than the concentration range claimed prevents the obtaining of solid solutions of lithium-magnesium-zinc-aluminosilicate with virgilite (β-quartz) or keatite structure, lowering the CTE of the material obtained. Introduction of $Al_2O_3$, MgO, ZnO and $Li_2O$ in an amount smaller and larger than the concentration range claimed, prevents the obtaining of transparent initial glass. Introduction of PbO in amounts less than suggested, does not lead to increasing refractive index of the material. Introduction of PbO in an amount larger than the concentration range claimed prevents the obtaining of transparent initial glass. Introduction of $TiO_2$ and $ZrO_2$ in an amount less than claimed prevents obtaining the solid monolithic material after the secondary heat-treatment. Introduction of $TiO_2$ and $ZrO_2$ in an amount greater than claimed leads to crystallization of the glass melt during casting. Introduction of the colouring agents NiO, CoO, CuO, $Cr_2O_3$, $Bi_2O_3$, $Fe_2O_3$, $MnO_2$, $CeO_2$, $Nd_2O_3$, $Er_2O_3$, $Pr_2O_3$ and Au in an amount less than claimed does not lead to material colouration. Introduction of NiO, CoO, CuO, $Cr_2O_3$, $Bi_2O_3$, $Fe_2O_3$, $MnO_2$, $CeO_2$, $Nd_2O_3$, $Er_2O_3$, $Pr_2O_3$ and Au in an amount greater than claimed leads to crystallization of the glass melt during casting.

Additional heat-treatment of the glass at the first stage at below 660° C. does not lead to liquid phase-separation and crystallization of titanium- and zirconium-containing phases, ensuring nanoscale crystallization of the initial glass. Additional heat-treatment of the glass at the first stage at above 800° C. leads to crystallization of large-size silicate crystals that damages the integrity of samples. The duration of the heat-treatment at the first stage which is less than 1 hour does not result in the phase separation of the initial glass, which damages the integrity of the samples after the heat treatment at the second stage. The duration of the heat treatment on the first stage which is more than 24 hours results in crystallization of undesired crystalline phases and therefore does not result in the desired colouration.

Heat treatment of the samples in the second stage at a temperature below 780° C. does not lead to crystallization of the desired phases, and therefore, does not result in the desired colours. Heat treatment of the samples in the second stage at a temperature above 1200° C. leads to melting of the material. The duration of the heat treatment in the second step which is less than 1 hour is unsufficient for crystallization. The duration of the second stage heat treatment which is more than 24 hours results in the destruction of crystals and colour loss.

The initial glass was heat-treated according to the schedules listed in Table 2. The characteristic of the crystalline phases was determined using X-ray diffraction analysis. The coefficient of thermal expansion and thermal shock resistance were measured as well. In each experiment, the initial glass was heated to a first temperature plateau at a rate of 300° C./hr, then was hold for a time sufficient to develop liquid phase separation, then the temperature was raised to a second plateau at a rate of 300° C./hour, and the material was hold for a time sufficient for crystallization of nanosized crystals of solid solution of lithium-magnesium-zinc-aluminosilicates with virgilite (β-quartz) structure or solid solution of lithium-magnesium-zinc-aluminosilicates with β-spodumene (keatite) structure and/or spinel, and/or quartz-like solid solutions, and/or sapphirine, and/or enstatite, and/or petalite, and/or cordierite, and/or willemite, and/or magnesium aluminotitanates, and/or zircon, and/or rutile, and/or zirconium titanate, and/or zirconium dioxide. The sample thus obtained was cooled to room temperature with the furnace.

Proposed material obtained by this method possesses uniform colour, optical characteristics similar to the characteristics of the main natural coloured minerals and manufacturable. A very important advantage of the material is its low coefficient of thermal expansion, hardness, chemical resistance and colour stability to thermal shock, which allows, in particular, accelerated mode of grinding and polishing as well as permits using the method of "casting with precious stones", as not only the faceted samples do not crack in contact with the of silver or gold melt, but they're also able to retain their colour.

The invention claimed is:

1. A heat-resistant synthetic jewelry material comprising:
   a composite nanocrystalline material having nanosized oxide and silicate crystalline phases, the composite nanocrystalline material comprising:

at least one crystalline phase selected from the group consisting of: spinel, quartz-like phases, sapphirine, enstatite, petalite-like phases, cordierite, willemite, zircon, magnesium aluminotitanates, rutile, zirconium titanate, and zirconium dioxide, and having a content of ions of transition elements, rare-earth elements and precious metals of from 0.001 to 4 mol %, at least one crystalline phase comprising solid solutions of lithium magnesium zinc aluminosilicates with a virgilite or keatite structure, wherein the composite nanocrystalline material comprises, in mol %: $SiO_2$—45-72; $Al_2O_3$—15-30; MgO—0.1-23.9; ZnO—0.1-29; $Li_2O$—1-18; PbO—0.1-7.0; $ZrO_2$—0.1-10; $TiO_2$—0.1-15; NiO—0.001-4.0; CoO—0.001-3.0; CuO—0.001-4.0; $Cr_2O_3$—0.001-1.0; $Bi_2O_3$—0.001-3.0; $Fe_2O_3$—0.001-3.0; $MnO_2$—0.001-3.0; $CeO_2$—0.001-3.0; $Nd_2O_3$—0.001-3.0; $Er_2O_3$—0.001-3.0; $Pr_2O_3$—0.001-3.0; Au—0.001-1.0.

2. The heat-resistant synthetic jewelry material of claim 1, wherein the composite nanocrystalline material is transparent, translucent, or opaque.

3. A heat-resistant synthetic jewelry material comprising:
a composite nanocrystalline material having nanosized oxide and silicate crystalline phases, the composite nanocrystalline material comprising:
at least one crystalline phase selected from the group consisting of: spinel, quartz-like phases, sapphirine, enstatite, petalite-like phase, cordierite, willemite, zircon, magnesium aluminotitanates, rutile, zirconium titanate, and zirconium dioxide; and
at least another crystalline phase comprising solid solutions of lithium magnesium zinc aluminosilicates with virgilite or keatite structure,
wherein the composite nanocrystalline material comprises the following in mol %: $SiO_2$—45-72; $Al_2O_3$—15-30; MgO—0.1-23.9; ZnO-0.1-29; $Li_2O$—1-18; PbO—0.1-7.0; $ZrO_2$—0.1-10; $TiO_2$—0.1-15; NiO—0.001-4.0; CoO—0.001-3.0; CuO—0.001-4.0; $Cr_2O_3$—0.001-1.0; $Bi_2O_3$—0.001-3.0; $Fe_2O_3$—0.001-3.0; $MnO_2$—0.001-3.0; $CeO_2$—0.001-3.0; $Nd_2O_3$—0.001-3.0; $Er_2O_3$—0.001-3.0; $Pr_2O_3$—0.001-3.0; Au—0.001-1.0.

4. The heat-resistant synthetic jewelry material of claim 3, wherein the composite nanocrystalline material is transparent, translucent, or opaque.

5. The heat-resistant synthetic jewelry material of claim 3, wherein the at least one crystalline phase comprises ions selected from the group consisting of transition elements, rare-earth elements, precious metals and compositions thereof.

6. The heat-resistant synthetic jewelry material of claim 5, wherein the ions comprise 0.001 to 4 mol % of the composite nanocrystalline material.

7. A heat-resistant synthetic jewelry material composition comprising:
a composite nanocrystalline material,
wherein the composite nanocrystalline material comprises:
45-72 mole percent $SiO_2$;
0.1-23.9 mole percent $Al_2O_3$;
0.1-23.9 mole percent MgO;
0.1-29 mole percent ZnO;
1.0-18.0 mole percent $Li_2O$;
0.1-7.0 mole percent PbO;
0.1-10.0 mole percent $ZrO_2$;
0.1-15.0 mole percent $TiO_2$;
0.001-4.0 mole percent NiO;
0.001-3.0 mole percent CoO;
0.001-1.0 mole percent CuO;
0.001-3.0 mole percent $Cr_2O_3$;
0.001-3.0 mole percent $Bi_2O_3$;
0.001-3.0 mole percent $Fe_2O_3$;
0.001-3.0 mole percent $MnO_2$;
0.001-3.0 mole percent $CeO_2$;
0.001-3.0 mole percent $Nd_2O_3$;
0.001-3.0 mole percent $Er_2O_3$;
0.001-3.00 mole percent $Pr_2O_3$; and
0.001-1.0 mole percent Au.

8. The heat-resistant synthetic jewelry material composition of claim 7, wherein the material is transparent, translucent or opaque.

9. The heat-resistant synthetic jewelry material composition of claim 7, wherein the composite nanocrystalline material has nanosized oxide and silicate crystalline phases.

10. The heat-resistant synthetic jewelry material composition of claim 7, wherein composite nanocrystalline material comprises at least one crystalline phase selected from the group consisting of: spinel, quartz phases, sapphirine, enstatite, petalite phases, cordierite, willemite, zircon, magnesium aluminotitanates, rutile, zirconium titanate, and zirconium dioxide.

* * * * *